United States Patent [19]

Jibu

[11] Patent Number: 4,523,217
[45] Date of Patent: Jun. 11, 1985

[54] SOLAR POWERED CIRCUIT HAVING CMOS AND BIPOLAR TRANSISTORS

[75] Inventor: Mitsuo Jibu, Ueno, Japan

[73] Assignee: Sharp Kabushiki Kaisha, Osaka, Japan

[21] Appl. No.: 495,253

[22] Filed: May 17, 1983

[30] Foreign Application Priority Data

May 31, 1982 [JP] Japan .................................. 57-93425

[51] Int. Cl.³ ............................................ H01L 27/02
[52] U.S. Cl. ....................................... 357/43; 357/30; 357/46; 307/311; 307/318
[58] Field of Search ....................... 357/42, 43, 45, 46, 357/30; 307/315, 318, 297, 311; 364/705, 707

[56] References Cited

U.S. PATENT DOCUMENTS

| | | | |
|---|---|---|---|
| 3,523,198 | 9/1970 | Keller | 307/318 |
| 3,995,308 | 11/1976 | Weinstein | 357/46 |
| 4,295,058 | 10/1981 | Lade et al. | 307/311 |
| 4,299,024 | 11/1981 | Piotrowski | 357/43 |

*Primary Examiner*—Martin H. Edlow
*Assistant Examiner*—Terri M. Henn
*Attorney, Agent, or Firm*—Birch, Stewart, Kolasch & Birch

[57] ABSTRACT

N-stage bipolar transistors are provided in a semiconductor substrate by using a manufacturing process of a CMOS LSI used for driving a solar powered electronic appliance. A reference voltage from a solar cell is applied to a base of a first bipolar transistor, and bases of i-th ($i \leq n$) bipolar transistors are connected to emitters of (i−1)-th bipolar transistors, thereby providing a constant voltage circuit in the semiconductor substrate.

2 Claims, 6 Drawing Figures

4,523,217

SOLAR POWERED CIRCUIT HAVING CMOS AND BIPOLAR TRANSISTORS

BACKGROUND OF THE INVENTION

This invention relates to a constant voltage circuit, and particularly to a constant voltage circuit using bipolar transistors which are integrally provided in a semiconductor substrate including MOS transistors.

Recently, hand-held electronic calculators (hereinafter denoted by electronic calculator) have been widely used. On the contrary, solar cell electronic calculators using solar cells as a power supply have been already developed in conjunction with the energy saving and the saving of resources, and such electronic calculators have been brought to the market.

FIG. 1 shows a structure of a conventional solar cell electronic calculator. A circuit 1, which executes arithmetic operations depending upon entered inputs, comprises a complementary MOS LSI (hereinafter denoted by CMOS LSI). The output of the CMOS LSI is applied to an output means such as a liquid crystal display device 2, thereby displaying arithmetic results and the contents of memory. The CMOS LSI 1 and the liquid crystal display device 2 execute desired arithmetic and display operations by using the photovoltaic power fed from the solar cell 3 as a power supply.

In the case of electronic appliances using the solar cell as the power supply, they are different from appliances employing a general cell or battery as the power supply, and the generated voltage of the solar cell depends upon the illumination of light under the employed condition. Therefore, the output of the solar cell becomes a considerably high voltage under high illumination as compared with a standard illumination. If such high voltage is applied to CMOS LSI etc., normally non-lighting segments of the liquid crystal may become half lit. Consequently, it is very difficult to see the displayed contents. In addition, since the load of the LSI for operating the appliance is made high, there is still a problem that a high allowable range of operation is required for the LSI.

In order to eliminate such a problem, the solar cell electronic calculators, which have been practically applied, include a voltage limiting circuit 4 which is constituted by connecting a resistor and an LED etc. between the solar cell 3 and CMOS LSI 1 as shown by a broken line in FIG. 1.

In a driving circuit for solar cell type appliances, the voltage limiting circuit 4 using the resistor and the LED must be provided in addition to the driving circuit of LSI for the purpose of the arithmetic operation and the display. However, it is not suitable to provide the voltage limiting circuit for small electronic appliances, such as electronic calculators, electronic wrist watches and the like, with a decreased number of components, and it can not be possible to satisfy the demand for lowering the cost. In addition, it was not practical to apply the voltage limiting circuit to small appliances because sufficient space for packaging is required.

OBJECT AND SUMMARY OF THE INVENTION

The present invention has been accomplished in view of above described problems, and provides a constant voltage circuit for supplying a stable voltage to an electronic applicance equipped with a solar cell.

Further, the present invention provides a constant voltage circuit including bipolar transistors in the same semiconductor substrate which constitutes a driving circuit for an electronic applicance by CMOS circuits and which does not vary the process for manufacturing CMOS circuits.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to one embodiment of the present invention, a constant voltage circuit comprises n-stage bipolar transistors in the semiconductor substrate so that a reference voltage is applied to a base of a first bipolar transistor, and that bases of i-th ($1 \leq n$) bipolar transistors are connected to emitters of (i−1)-th bipolar transistors.

BRIEF DESCRIPTION OF THE DRAWINGS

The present invention will be better understood from the detailed description given hereinafter and the accompanying drawings which are given by way of illustration only, and thus are not limitative of the present invention and wherein.

DETAILED DESCRIPTION OF THE INVENTION

Figure 1:
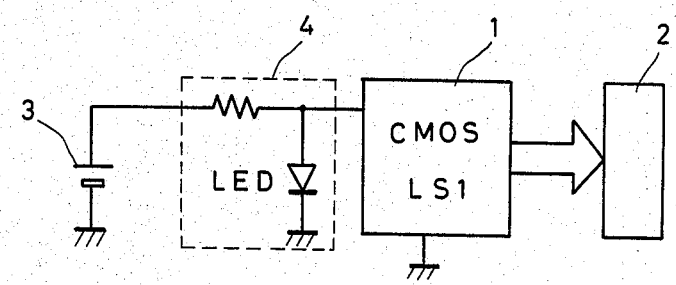
FIG. 1 is a block diagram of a conventional device.
Figure 2:
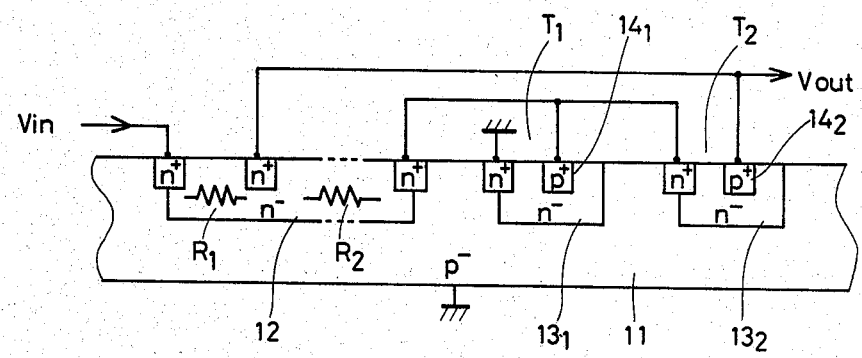
FIG. 2 is a cross-sectional view showing a semiconductor substrate according to one embodiment of the present invention.
Figure 3:
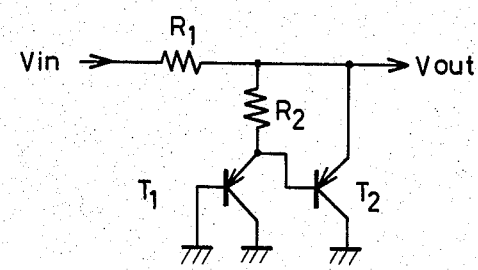
FIG. 3 is a circuit diagram of the embodiment of FIG. 2.

In FIG. 2, arithmetic circuits and memory circuits acting as electronic calculators or electronic wrist watches are provided in $p^-$-type semiconductor substrate 11 by known CMOS circuit structure which includes p and n channel MOS transistors. A voltage limiting circuit constituted by bipolar transistors $T_1$ and $T_2$ and resistors $R_1$ and $R_2$, as shown in FIG. 3, is integrally formed in the semiconductor substrate 11.

In FIG. 2, $n^-$-type region 12 for producing resistance and a plurality of $n^-$-type regions $13_1$, $13_2$ and the like for producing bipolar transistors are provided in $p^-$-type semiconductor substrate 11 simultaneously with producing n-type source and drain regions of CMOS transistors and n-type wells therein. In the drawing, $n^+$-type regions are high impurity concentation regions for obtaining ohmic contacts. The $n^-$-type regions $13_1$ and $13_2$ are base regions of bipolar transistors whose collectors are given by $p^-$-type semiconductor substrate 11. In addition, $p^+$-type regions $14_1$ and $14_2$ serving as emitters are provided in $n^-$-type regions $13_1$ and $13_2$ by the same process as that for producing p-type source and drain regions of CMOS transistors. As shown in FIG. 3, $n^-$-type regions 12, $13_1$ and $13_2$ and $p^+$-type regions $14_1$ and $14_2$ of the semiconductor substrate 11 are interconnected so that an input voltage $V_{in}$ reaches both the emitter $14_1$ of bipolar transistor $T_1$ and the base $13_2$ of bipolar transistor $T_2$ through resistors $R_1$ and $R_2$, an output voltage $V_{out}$ is fed from the input voltage $V_{in}$ through the resistor $R_1$, and the output terminal of the output voltage $V_{out}$ is connected to the emitter $14_2$ of bipolar transistor $T_2$. In this case, $p^-$-type semiconductor substrate 11 acting as collectors are grouded, and the base $13_1$ of bipolar transistor $T_1$ is also grounded to keep it at the reference potential.

Figure 4:
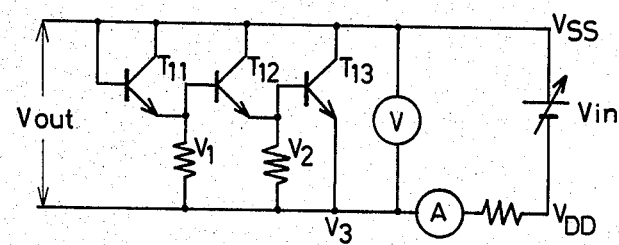
FIG. 4 is a measuring circuit for explaining another embodiment of the present invention.

The basic circuit is the constant voltage circuit in which p-n-p transistors are connected in two stages. FIG. 4 is an embodiment in which n-p-n transistors are connected in three stages, and also shows a measuring circuit to which an ammeter A and a voltmeter V for measuring the current I and the output voltage $V_{out}$ are connected when the input voltage $V_{in}$ is applied thereto. The base of first bipolar transistor $T_{11}$ is connected to the reference potential $V_{ss}$, and each base of second and third bipolar transistors $T_{12}$ and $T_{13}$ is connected to the emitter of previous bipolar transistors $T_{11}$ and $T_{12}$, respectively.

Figure 5:
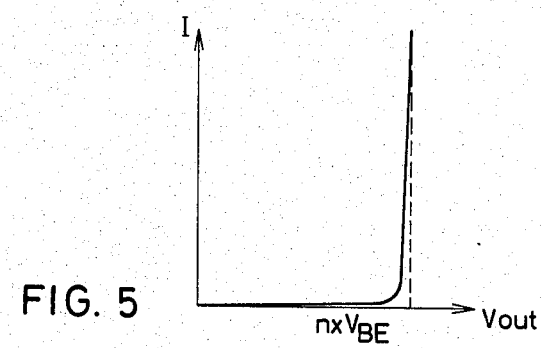
FIGS. 5 and 6 are $V_{out}-I$ and $V_{out}-V_{in}$ characteristics showing measured results of the embodiment.
Figure 6:
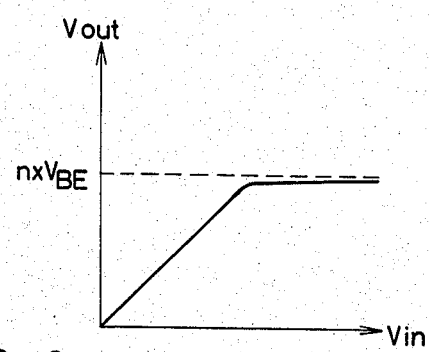

In the circuit configuration, if the voltage between the base and the emitter of each bipolar transistor is equal to one another and is given by $V_{BE}$, the voltage $V_1$ applied to the emitter terminal of first bipolar transistor $T_{11}$ becomes $V_{ss}-V_{BE}$. Similarly, the emitter terminal voltage $V_2$ of second bipolar transistor $T_{12}$ becomes $V_{ss}-2V_{BE}$, and $V_3$ becomes $V_{ss}-3V_{BE}$, respectively. Accordingly, in the circuit wherein n-stage bipolar transistors are successively connected to one another, the current flows at the value of about $n \times V_{BE}$ as shown by $V_{out}-I$ characteristic of FIG. 5. Further, the constant output voltage given by about $n \times V_{BE}$ can be obtained as shown by $V_{in}-V_{out}$ characteristic of FIG. 6 even if the input voltage $V_{in}$ is increased. Therefore, if the input voltage $V_{in}$ is given by the output of the solar cell and the cell is exposed to high illumination, stabilized output voltage of $n \times V_{BE}$ can be provided to regulate the power supply voltage for electronic appliances.

According to the present invention, the constant voltage circuit can be simultaneously produced using the manufacturing process of CMOS LSI for driving the electronic appliance, and the number of components can be reduced since it is not necessary to provide a discrete circuit device for the LSI, thereby lowering the manufacturing cost of appliances and further facilitating the packaging of circuit components. The present invention can be effectively applied to appliances using solar cells as the power supply.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A circuit powered by a solar cell for use in an electronic appliance comprising:

appliance control circuit means including a first conductivity type semiconductor substrate having p and n channel complementary MOS transistors; and constant voltage control circuit means for supplying a constant reference voltage to said appliance circuit including N ($N \geq 2$) bipolar transistors provided in the same said semiconductor substrate, said semiconductor substrate serving as a collector region, each transistor including a second conductivity type base region formed in said collector region and a first conductivity type emitter region formed in said base region, the base region of said first bipolar transistor being connected to a reference potential provided by said solar cell, the base regions of i-th ($i \leq N$) bipolar transistors being connected to the emitter regions of (i−1)-th bipolar transistors.

2. The circuit of claim 1, wherein said appliance is a calculator.

* * * * *